(12) United States Patent
Patel et al.

(10) Patent No.: US 9,871,325 B2
(45) Date of Patent: Jan. 16, 2018

(54) CIRCUIT BOARD HAVING SELECTIVE VIAS FILLED WITH LOSSY PLUGS

(71) Applicant: TYCO ELECTRONICS CORPORATION, Berwyn, PA (US)

(72) Inventors: Sandeep Patel, Middletown, PA (US); Bruce Allen Champion, Camp Hill, PA (US); Linda Ellen Shields, Camp Hill, PA (US); Michael John Phillips, Camp Hill, PA (US); Thomas Taake de Boer, Hummelstown, PA (US); John Joseph Consoli, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 14/996,692

(22) Filed: Jan. 15, 2016

(65) Prior Publication Data

US 2017/0207579 A1    Jul. 20, 2017

(51) Int. Cl.
*H01R 13/66*    (2006.01)
*H01R 13/6473*    (2011.01)
*H01R 12/72*    (2011.01)

(52) U.S. Cl.
CPC ....... *H01R 13/6473* (2013.01); *H01R 12/721* (2013.01)

(58) Field of Classification Search
USPC ............. 439/620.22, 76.1; 29/852; 427/97.1, 427/97.2; 361/746, 761
See application file for complete search history.

(56) References Cited

U.S. PATENT DOCUMENTS 5,906,042 A * 5/1999 Lan ..................... H01L 23/5382
257/E23.171
5,913,688 A * 6/1999 Marian, Jr. ........ H01R 13/2435
439/76.1

* cited by examiner

*Primary Examiner* — Vanessa Girardi

(57) ABSTRACT

An interconnect system includes a circuit board including a substrate having a first surface and a second surface opposite the first surface, a plurality of signal conductors and a plurality of ground conductors including respective contact pads in a mating area of the substrate for engaging corresponding contacts of an electrical connector, and a plurality of ground vias extending at least partially through the substrate between the first and second surfaces. The ground vias are coupled to corresponding ground conductors. The ground vias include lossy plugs at least partially filling the ground vias. The lossy plugs are manufactured from lossy material capable of absorbing electrical resonance propagating through the substrate.

20 Claims, 4 Drawing Sheets

CIRCUIT BOARD HAVING SELECTIVE VIAS FILLED WITH LOSSY PLUGS

BACKGROUND

The subject matter herein relates generally to circuit boards having signal and ground pathways.

Communication systems exist today that utilize pluggable connector assemblies to transmit data. For example, network systems, servers, data centers, and the like may use numerous cable assemblies to interconnect the various devices of the communication system. Cable assemblies may include a pluggable connector that is configured to be inserted into a receptacle assembly of a communication system. The pluggable connector includes signal pathways and ground pathways in which the signal pathways convey data signals and the ground pathways control impedance and reduce crosstalk between the signal conductors. In differential signaling applications, the signal pathways are arranged in signal pairs for carrying the data signals. Each signal pair may be separated from an adjacent signal pair by one or more ground pathways.

The pluggable connectors may be configured to transfer electrical signals in accordance with industry standards. By way of example, known industry standards for pluggable connectors include small-form factor pluggable (SFP), enhanced SFP (SFP+), quad SFP (QSFP), C form-factor pluggable (CFP), and 10 Gigabit SFP, which is often referred to as XFP. Among other things, these standards may require that the pluggable connectors have certain physical configurations or structures.

There has been a general demand to increase the speeds at which data is transmitted through the communication systems. As data rates increase, however, it becomes more challenging to maintain a baseline level of signal quality. For example, electrical energy that flows along the surface of each ground pathway may form a field that propagates between the ground pathways. The ground pathways may couple with each other to support an unwanted electrical propagation mode that is repeatedly reflected and forms a resonating condition (or standing wave). Electrical noise caused by the resonating condition may increase return loss and/or crosstalk and reduce throughput of the interconnect system.

To control resonance between ground pathways and limit the effects of the resulting electrical noise, it has been proposed to electrically common the ground pathways using metal grounding bars, ground planes or grounded housings. The effectiveness and/or cost of implementing these techniques is based on a number of variables, such as the geometries of the signal and ground pathways within the interconnect system. Moreover, these techniques are usually applied to the receptacle assembly that receives the pluggable connector. It may be difficult to implement these and other techniques in pluggable connectors due to the structural requirements for pluggable connectors that are set by the industry standards.

Accordingly, there is a need for interconnect systems that reduce electrical noise caused by resonating conditions in ground pathways.

BRIEF DESCRIPTION

In an embodiment, a circuit board is provided including a substrate having a first surface and a second surface opposite the first surface, a plurality of signal conductors and a plurality of ground conductors including respective contact pads in a mating area of the substrate for engaging corresponding contacts of an electrical connector, and a plurality of ground vias extending at least partially through the substrate between the first and second surfaces. The ground vias are coupled to corresponding ground conductors. The ground vias include lossy plugs at least partially filling the ground vias. The lossy plugs are manufactured from lossy material capable of absorbing electrical resonance propagating through the substrate.

In another embodiment, a pluggable connector assembly is provided including a plug housing configured to couple to a communication cable and a circuit board held by the plug housing configured to be communicatively coupled to the communication cable. The circuit board has a substrate including a mating edge configured to interface with an electrical connector. The substrate including a plurality of signal conductors and a plurality of ground conductors including respective contact pads that are disposed proximate to the mating edge for engaging corresponding contacts of the mating connector. The substrate has a plurality of ground vias extending at least partially through the substrate. The ground vias are coupled to corresponding ground conductors. The ground vias include lossy plugs at least partially filling the ground vias. The lossy plugs are manufactured from lossy material capable of absorbing electrical resonance propagating through the substrate.

In another embodiment, an interconnect system is provided including a receptacle connector assembly and a pluggable connector assembly configured to be inserted into the receptacle connector during a mating operation. The receptacle connector assembly has a first circuit board and a receptacle connector mounted to the first circuit board. The receptacle connector has a receiving cavity and an array of electrical contacts disposed within the receiving cavity. The electrical contacts include signal contacts and ground contacts. The first circuit board includes a first substrate and signal conductors and ground conductors routed on the first substrate. The signal contacts of the receptacle connector are terminated to corresponding signal conductors of the first circuit board and the ground contacts of the receptacle connector are terminated to corresponding ground conductors of the first circuit board. The first circuit board includes a plurality of ground vias extending at least partially through the first substrate being coupled to corresponding ground conductors. The ground vias include lossy plugs at least partially filling the ground vias. The lossy plugs are manufactured from lossy material absorbing electrical resonance propagating through the substrate. The pluggable connector assembly includes a second substrate having a first surface and a second surface opposite the first surface. The second substrate has a plurality of signal conductors and a plurality of ground conductors. The signal and ground conductors include respective contact pads in a mating area of the second substrate for engaging corresponding signal and ground contacts of the receptacle connector. The second substrate has a plurality of ground vias extending at least partially through the second substrate between the first and second surfaces. The ground vias are coupled to corresponding ground conductors of the second substrate. The ground vias include lossy plugs at least partially filling the ground vias. The lossy plugs are manufactured from lossy material capable of absorbing electrical resonance propagating through the substrate.

DETAILED DESCRIPTION

Embodiments set forth herein may include various electrical connectors that are configured for communicating data signals. In various embodiments, the electrical connectors provide lossy ground absorbers to provide resonance control. For example, in various embodiments, the lossy ground absorbers are provided on or in substrates of the electrical connectors, such as in circuit boards associated with the electrical connectors. For example, the lossy ground absorbers may be embedded in the circuit boards, such as in ground vias of the circuit boards to provide resonance control. Embodiments may include plug connectors, receptacle connectors, circuit board mounting connectors, cable mounted connectors or interconnect systems. Various embodiments are particularly suitable for high-speed communication systems, such as network systems, servers, data centers, and the like, in which the data rates may be greater than four (4) gigabits/second (Gbps). Particular embodiments may be capable of transmitting data at a rate of at least about 10 Gbps, at least about 20 Gbps, at least about 28 Gbps, at least about 56 Gbps, or more. However, it is also contemplated that embodiments may transmit at slower transmission speeds or data rates.

Embodiments include conductive pathways that may include one or more interconnected conductive elements, such as traces and vias. The conductive pathways include signal and ground pathways that are positioned relative to each other to form a designated pattern that is suitable for communicating data signals at the desired data rate. In particular embodiments, the signal pathways form signal pairs in which each signal pair is flanked on both sides by ground pathways such as in a ground-signal-signal-ground (GSSG) array. The ground pathways electrically separate the signal pairs to reduce electromagnetic interference or crosstalk and to provide a reliable ground return path. Other embodiments, however, may not include signal pairs. For example, each signal pathway may be flanked on both sides by ground pathways.

Figure 1:
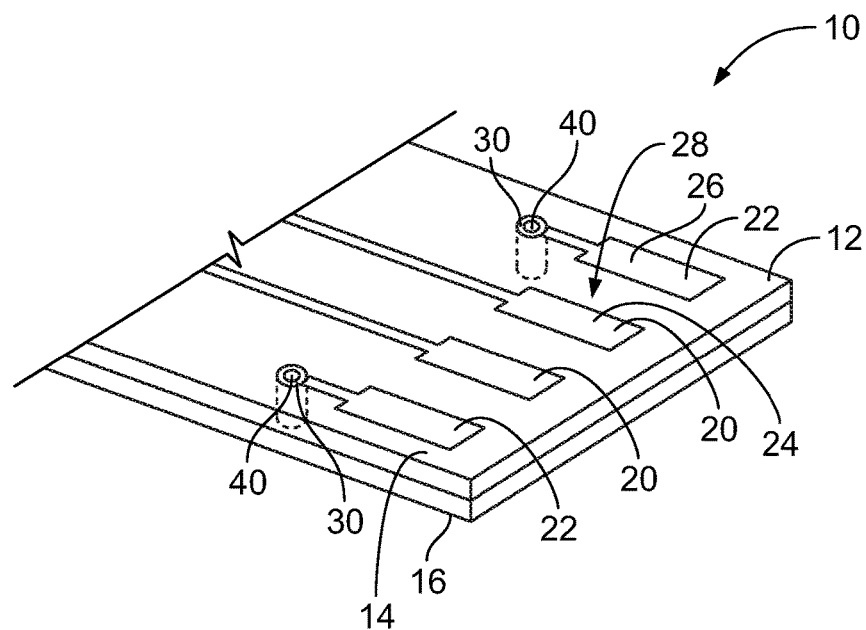
FIG. 1 is a schematic view of a circuit board formed in accordance with an exemplary embodiment.

FIG. 1 is a schematic view of a circuit board 10 formed in accordance with an exemplary embodiment. The circuit board 10 may be part of an electrical connector or an electrical connector assembly. For example, the circuit board 10 may be held in a pluggable module, the circuit board 10 may be a paddle-card style board, the circuit board 10 may have an electrical connector mounted thereto, and the like.

The circuit board 10 includes a substrate 12 having a first surface 14 and a second surface 16 opposite the first surface 14. The circuit board 10 may be a layered structure, such as manufactured through printed circuit board (PCB) technologies. The circuit board 10 may be a laminate or sandwich structure that includes a plurality of stacked substrate layers having conductive elements that extend on or between the substrate layers (e.g., traces, ground planes, and the like) and/or extend through the substrate layers (e.g., vias, plated thru-holes, and the like). By way of example, the substrate layers may include a dielectric material and may also include a bonding material. The conductive elements may be disposed, deposited, or etched in a predetermined manner within or along the substrate layers.

In an exemplary embodiment, the substrate 12 has a plurality of signal conductors 20 and a plurality of ground conductors 22. The signal conductors 20 and/or ground conductors 22 may be traces, pads, planes, plated vias, and the like. In an exemplary embodiment, the signal and ground conductors 20, 22 including respective signal and ground contact pads 24, 26 in a mating area 28 of the substrate 12 for engaging corresponding contacts of an electrical connector. The contact pads 24, 26 may be on one or both of the surfaces 14, 16 and/or may extend at least partially through the substrate 12 (for example, as plated vias).

In an exemplary embodiment, the substrate 12 has a plurality of ground vias 30 extending at least partially through the substrate 12 between the first and second surfaces 14, 16. The ground vias 30 are coupled to corresponding ground conductors 22. For example, the ground conductors 22 may include traces on the surface(s) 14, 16 that extend to the ground vias 30, which may be plated or non-plated. The ground vias 30 may extend partially through the substrate 12, such as to one or more ground planes, or may extend entirely through the substrate 12 as throughholes.

Lossy plugs 40 at least partially fill the ground vias 30. The lossy plugs 40 are manufactured from lossy material capable of absorbing electrical resonance propagating through the substrate 12. In an exemplary embodiment, the lossy plugs 40 includes lossy material configured to absorb at least some electrical resonance that propagates along the current paths defined by the signal conductors 20 and/or the ground conductors 22 through the circuit board 10. The lossy material is embedded in the circuit board 10 by partially or entirely filling the ground vias 30. The lossy material has dielectric properties that vary with frequency. The lossy material provides lossy conductivity and/or magnetic lossiness through a portion of the circuit board. The lossy material is able to conduct electrical energy, but with at least some loss. The lossy material is less conductive than conductive material, such as the conductive material of the conductors 20, 22. The lossy material may be designed to provide electrical loss in a certain, targeted frequency range, such as by selection of the lossy material, placement of the lossy material, proximity of the lossy material to the ground paths and the signal paths, and the like. The lossy material may include conductive particles (or fillers) dispersed within a dielectric (binder) material. The dielectric material, such as a polymer or epoxy, is used as a binder to hold the conductive particle filler elements in place. These conductive particles then impart loss to the lossy material. In some embodiments, the lossy material is formed by mixing binder with filler that includes conductive particles. Examples of conductive particles that may be used as a filler to form electrically lossy materials include carbon or graphite formed as fibers, flakes, or other particles. Metal in the form of powder, flakes, fibers, or other conductive particles may also be used to provide suitable lossy properties. Alternatively, combinations of fillers may be used. For example, metal plated (or coated) particles may be used. Silver and nickel may also be used to plate particles. Plated (or coated) particles may be used alone or in combination with other fillers, such as carbon flakes. In some embodiments, the fillers may be present in a sufficient volume percentage to allow conducting paths to be created from particle to particle. For example when metal fiber is used, the fiber may be present at an amount up to 40% by volume or more. The lossy material may be magnetically lossy and/or electrically lossy. For example, the lossy material may be formed of a binder material with magnetic particles dispersed therein to provide magnetic properties. The magnetic particles may be in the form of flakes, fibers, or the like. Materials such as magnesium ferrite, nickel ferrite, lithium ferrite, yttrium garnet and/or aluminum garnet may be used as magnetic particles. In some embodiments, the lossy material may simultaneously be an electrically-lossy material and a magnetically-lossy material. Such lossy materials may be formed, for example, by using magnetically-lossy filler particles that are partially conductive or by using a combination of magnetically-lossy and electrically-lossy filler particles.

As used herein, the term "binder" encompasses material that encapsulates the filler or is impregnated with the filler. The binder material may be any material that will set, cure, or can otherwise be used to position the filler material. In some embodiments, the binder may be a thermoplastic material, an epoxy-woven glass board (FR4) material or another dielectric material. However, many alternative forms of binder materials may be used. Curable materials, such as epoxies, can serve as a binder. Alternatively, materials such as thermosetting resins or adhesives may be used. The material may be molded, such as molding of the lossy plug 40 into the desired shape and/or location. The material may be molded in place in the substrate 12.

Electrical performance of the circuit board 10 and the overall system is enhanced by the inclusion of the lossy material in the lossy plugs 40. For example, at various data rates, including high data rates, return loss is inhibited by the lossy material. For example, the return loss of the small pitch, high speed data of the arrays of conductors 20 due to the close proximity of signal and ground conductors 20, 22 is reduced by the lossy plugs 40. For example, energy from the ground conductors 22 and/or ground planes on either side of the signal conductors 20 reflected in the various layers of the substrate 12 is absorbed, and thus connector performance and throughput is enhanced.

Figure 2:
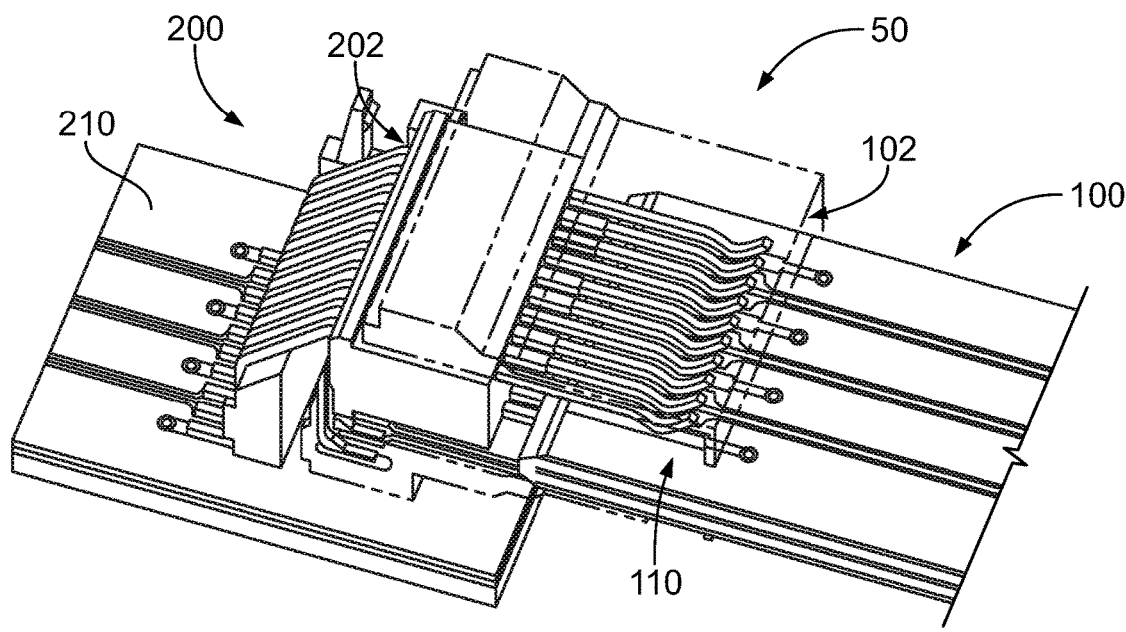
FIG. 2 is a perspective view of an interconnect system formed in accordance with an exemplary embodiment having a pluggable connector assembly and a receptacle connector assembly.

FIG. 2 is a perspective view of an interconnect system 50 formed in accordance with an exemplary embodiment. The interconnect system 50 includes a pluggable connector assembly 100 and a receptacle connector assembly 200. The pluggable connector assembly 100 is mated with the receptacle connector assembly 200. Portions of the pluggable connector assembly 100 are shown in phantom to illustrate various components of the interconnect system 50. Portions of the receptacle connector assembly 200 are shown in phantom to illustrate various components of the interconnect system 50.

The pluggable connector assembly 100 includes a pluggable connector 102. In an exemplary embodiment, the pluggable connector assembly 100 includes a circuit board 110, which may include or be similar to the circuit board 10 (shown in FIG. 1). For example, in the illustrated embodiment, the circuit board 110 is a module board or circuit card held in the pluggable connector 102. The circuit board 110 may be a paddle-card type of board. In some applications, the pluggable connector 102 may be referred to as a pluggable transceiver connector or as a pluggable input/output (I/O) connector; however the subject matter herein is not limited to such types of connectors but rather may apply to any type of connector assembly having a circuit board.

The receptacle connector assembly 200 includes a receptacle connector 202. In an exemplary embodiment, the receptacle connector assembly 200 includes a circuit board 210, which may include or be similar to the circuit board 10 (shown in FIG. 1). For example, optionally, the circuit board 210 may be a daughtercard or backplane. The receptacle connector 202 may be mounted to the circuit board 210.

In an exemplary embodiment, either or both circuit boards 110, 210 may include lossy material, such as in the form of lossy plugs, to provide electrical and/or magnetic absorption. The lossy material is configured to absorb at least some resonance that propagates along the current paths through the circuit board(s) 110 and/or 210.

Figure 3:
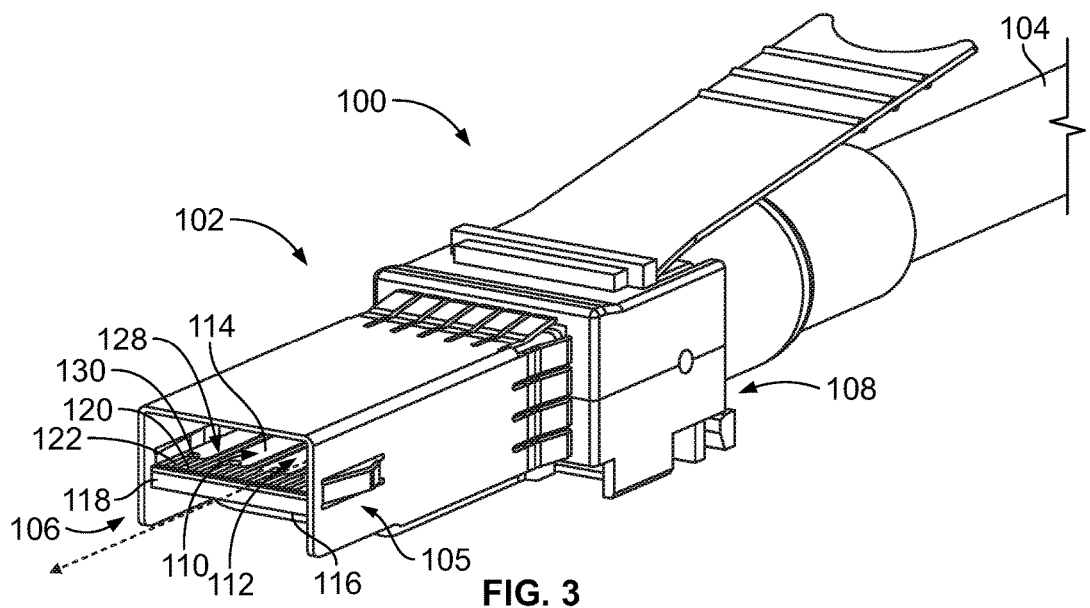
FIG. 3 is a perspective view of the pluggable connector assembly formed in accordance with an exemplary embodiment.

FIG. 3 is a perspective view of the pluggable connector assembly 100 formed in accordance with an exemplary embodiment. The pluggable connector assembly 100 includes the pluggable connector 102 and the circuit board 110. In the illustrated embodiment, a communication cable 104 extends from a plug housing 105 of the pluggable connector 102. The cable 104 is electrically connected to the circuit board 110. The plug housing 105 holds the circuit board 110 therein. The pluggable connector 102 has a mating end 106 and a cable end 108 opposite the mating end 106. The mating end 106 is configured to be mated to an electrical connector, such as the receptacle connector 202, of the receptacle connector assembly 200 (shown in FIG. 2). The cable 104 extends from the cable end 108.

The pluggable connector assembly 100 may be configured for various applications. Non-limiting examples of such applications include host bus adapters (HBAs), redundant arrays of inexpensive disks (RAIDs), workstations, servers, storage racks, high performance computers, or switches. The pluggable connector assembly 100 may be configured to be compliant with industry standards, such as, but not limited to, the small-form factor pluggable (SFP) standard, enhanced SFP (SFP+) standard, quad SFP (QSFP) standard, C form-factor pluggable (CFP) standard, and 10 Gigabit SFP standard, which is often referred to as the XFP standard.

The plug housing 105 is directly or indirectly coupled to the communication cable 104. Optionally, the plug housing 105 may be metal to provide electrical shielding for the circuit board 110. At least a portion of the plug housing 105 may be inserted into the receptacle connector assembly 200 when mated thereto. Alternatively, the plug housing 105 may not be inserted into the receptacle connector assembly 200, but rather, only the circuit board 110 may be inserted into the receptacle connector assembly 200.

Figure 4:
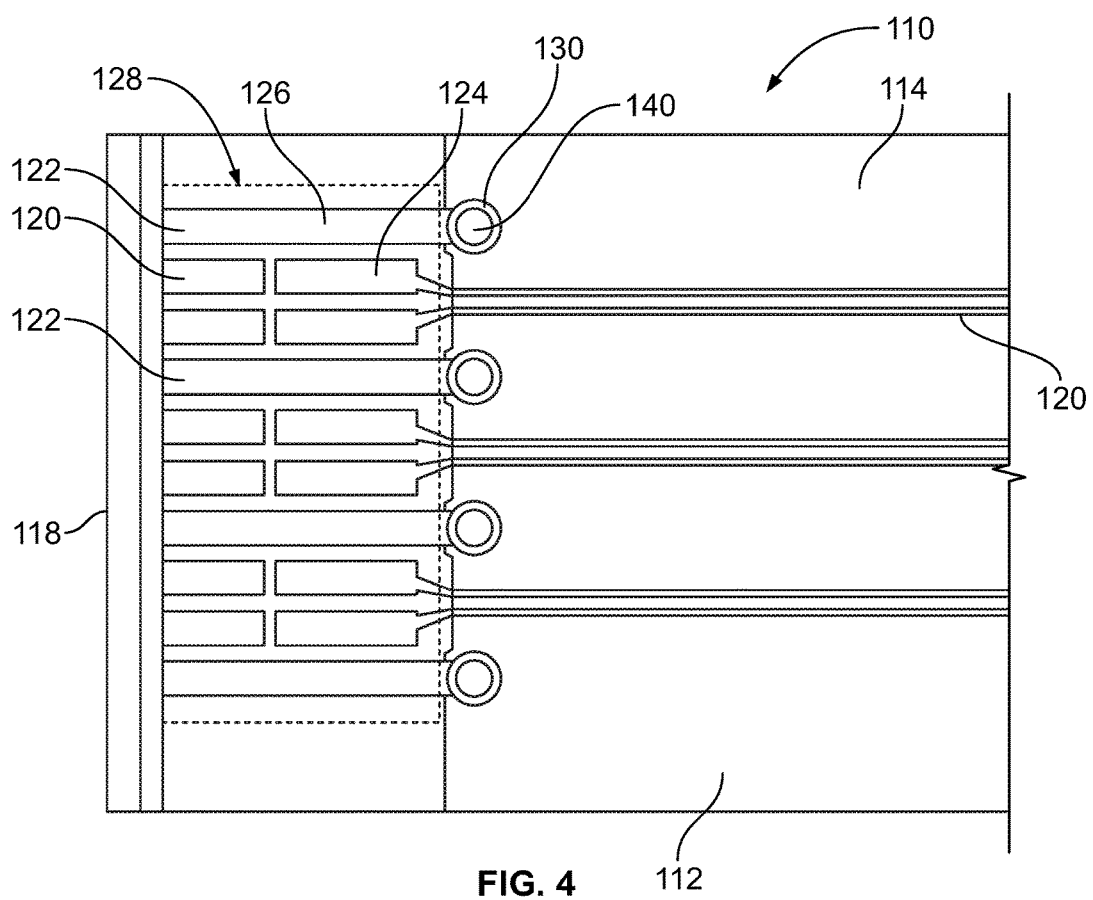
FIG. 4 is a top view of a portion of a circuit board of the pluggable connector assembly.

With additional reference to FIG. 4, which is a top view of a portion of the circuit board 110, in an exemplary embodiment, the circuit board 110 includes a substrate 112 having a first surface 114 and a second surface 116 opposite the first surface 114. The circuit board 110 extends to a mating edge 118 configured to be inserted into the receptacle connector assembly 200 when mated thereto. The circuit board 110 may be manufactured through a variety of fabrication technologies. For example, the circuit board 110 may be manufactured through printed circuit board (PCB) technologies. The circuit board 110 may be a laminate or sandwich structure that includes a plurality of stacked substrate layers having conductive elements that extend between the substrate layers (e.g., traces, ground planes, and the like) or extend through the substrate layers (e.g., vias, plated thru-holes, and the like). By way of example, the substrate layers may include a dielectric material (e.g., flame-retardant epoxy-woven glass board (FR4), FR408, polyimide, polyimide glass, polyester, epoxy-aramid, metals, and the like). The substrate layers may also include a bonding material (e.g., acrylic adhesive, modified epoxy, phenolic butyral, pressure-sensitive adhesive (PSA), preimpregnated material, and the like). The conductive elements may be disposed, deposited, or etched in a predetermined manner within or along the substrate layers. By way of example, the conductive elements may comprise copper (or a copper-alloy), cupro-nickel, silver epoxy, and the like.

In an exemplary embodiment, the substrate 112 has a plurality of signal conductors 120 and a plurality of ground conductors 122. The conductors 120, 122 may be provided on the first board surface 114 and/or on the second board surface 116. At least portions of the signal and ground conductors 120, 122 are coplanar and are exposed along the board surface 114 and/or along the board surface 116. The signal conductors 120 and/or ground conductors 122 may be traces, pads, planes, plated vias, and the like. The conductive pathways defined by the signal and ground conductors 120, 122 are positioned relative to each other to form a designated pattern or array that is suitable for communicating data signals at the desired data rate. In particular embodiments, the signal conductors 120 form signal pairs in which each signal pair is flanked on both sides by ground conductors 122 such as in a ground-signal-signal-ground (GSSG) array. The ground conductors 122 electrically separate the signal pairs to reduce electromagnetic interference or crosstalk and to provide a reliable ground return path. Other embodiments, however, may not include signal pairs. For example, each signal conductor 120 may be flanked on both sides by ground conductors 122 or many signal conductors 120 may be provided between corresponding ground conductors 122. In an exemplary embodiment, the ground conductors 122 include or are coupled to lossy material to dampen or absorb resonance in the circuit board 110.

As described herein, the ground conductors 122 include damping (or resonance-control) components in the form of lossy plugs 140 along segments of the conductive pathways thereof. The lossy plugs 140 may impede the formation of standing waves (or resonating conditions) at certain frequencies. In an exemplary embodiment, the damping components include a single lossy plug 140 along each ground pathway. However, in other embodiments, multiple lossy plugs 140 may be provided along each ground pathway.

In an exemplary embodiment, the signal and ground conductors 120, 122 including respective signal and ground contact pads 124, 126 in a mating area 128 of the substrate 112 for engaging corresponding contacts of an electrical connector. The mating area 128 may be at or near the mating edge 118. The contact pads 124, 126 may be on one or both of the surfaces 114, 116 and/or may extend at least partially through the substrate 112 (for example, as plated vias). The contact pads 124, 126 may be wider than other portions of the conductors 120, 122, such as the traces on the various layers of the substrate 112. The contact pads 124, 126 may define a contact array at the mating edge 118.

In an exemplary embodiment, the communication cable 104 includes a plurality of insulated wires that are stripped to expose wire conductors. The exposed wire conductors are terminated to the signal and ground conductors 120, 122, such as at corresponding pads at a terminating end of the circuit board 110 opposite the mating end. Although not shown, the circuit board 110 may include one or more processing units attached thereto that modify the data signals during operation.

In an exemplary embodiment, the substrate 112 has a plurality of ground vias 130 extending at least partially through the substrate 112 between the first and second surfaces 114, 116. The ground vias 130 extend a depth into the substrate 112 to electrically couple to one or more ground planes 132 (shown in FIG. 7). At least some of the ground vias 130 are coupled to corresponding ground conductors 122, while other ground vias 130 may not be associated with any ground conductors 122 but rather may be provided at any location within the substrate 112 and electrically connected to one or more of the ground planes 132 of the circuit board 110. The ground conductors 122 may include traces on the surface(s) 114, 116 that extend to corresponding ground vias 130, which may be plated or non-plated. The ground vias 130 may extend partially through the substrate 112, such as to one or more ground planes 132, or may extend entirely through the substrate 112 as through-holes. Optionally, the ground vias 130 may extend entirely through the circuit board 110 between the first and second surfaces 114, 116 to electrically connect ground pads 126 on both the first and second surfaces 114, 116. In an exemplary embodiment, each of the ground conductors 122 along the board surface 114 may be electrically coupled to a common ground plane 132 such that the ground conductors 122 along the board surface 114 are electrically common.

The lossy plugs 140 at least partially fill the ground vias 130. The lossy plugs 140 are manufactured from lossy material capable of absorbing electrical resonance propagating through the substrate 112. In an exemplary embodiment, the lossy plugs 140 include lossy material configured to absorb at least some electrical resonance that propagates along the current paths defined by the signal conductors 120 and/or the ground conductors 122 through the circuit board 110. Optionally, the lossy plugs 140 may be connected to ground pads 126 on both the first and second surfaces 114, 116. Alternatively, upper lossy plugs 140 may be connected to ground pads 126 on the first surface 114 while lower lossy plugs 140 may be connected to ground pads 126 on the second surface 116. The upper lossy plugs 140 may be laterally offset (side-to-side) from the lower lossy plugs 140 because the arrays of signal and ground conductors 120, 122 at the first and second surfaces 114, 116 may be different or offset.

The lossy plugs 140 may be located at a designated location along the electrical path length of the ground conductors 122 that is configured to impede formation of a standing wave or resonating condition. The designated location may be at a predetermined distance from the nominal mating interface of the ground pad 126. The predetermined distance may be determined through calculations and/or simulations of a proposed pluggable connector design. Alternatively or in addition to, the predetermined distance may be determined through multiple tests or trials of the pluggable connector. The designated location may also be configured to satisfy an industry standard. Optionally, the lossy plugs 140 may be positioned as close as possible to the ground pad 126 or nominal mating interface of the ground pad 126. In other various embodiments, the lossy plug 140 may be positioned at the far end of the ground pad 126 away from the mating edge 118. Optionally, multiple lossy plugs 140 may be provided, such as one near the mating edge 118 and another at the far end of the ground pad 126 such that the mating interface of the ground contact to the ground pad 126 is between the lossy plugs 140. Other positions of the lossy plugs 140 are possible in alternative embodiments. Optionally, the lossy plugs 140 may be staggered relative to the mating edge 118.

Figure 5:
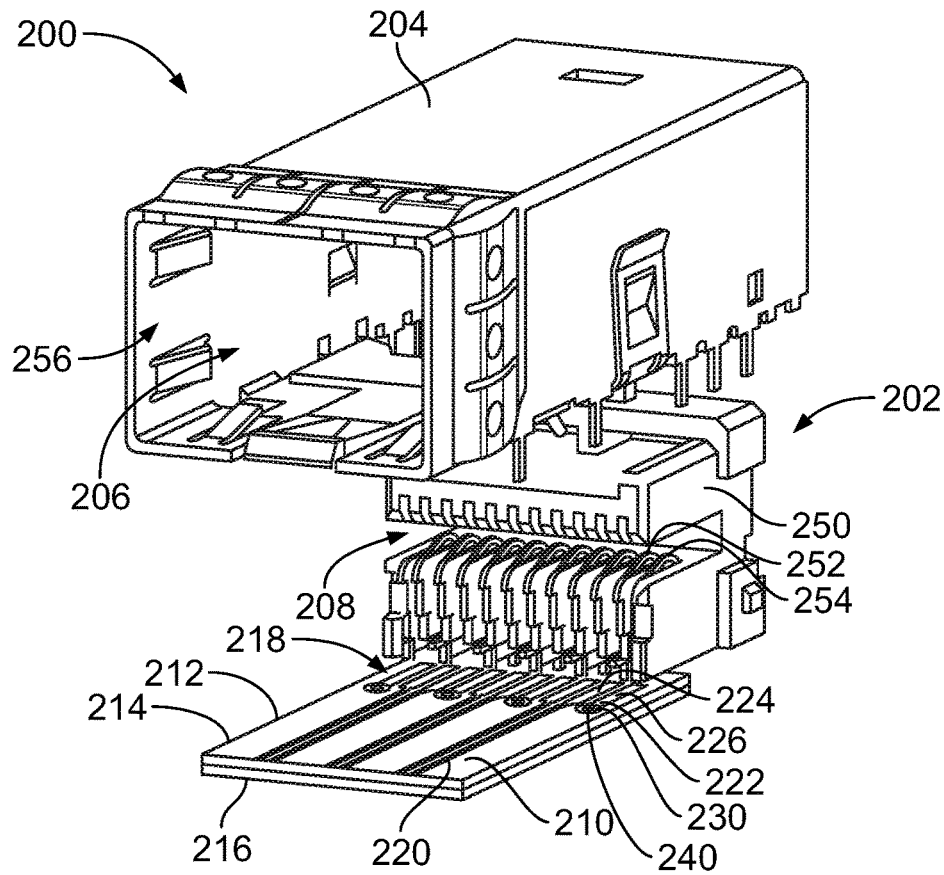
FIG. 5 is an exploded view of the receptacle connector assembly.
Figure 6:
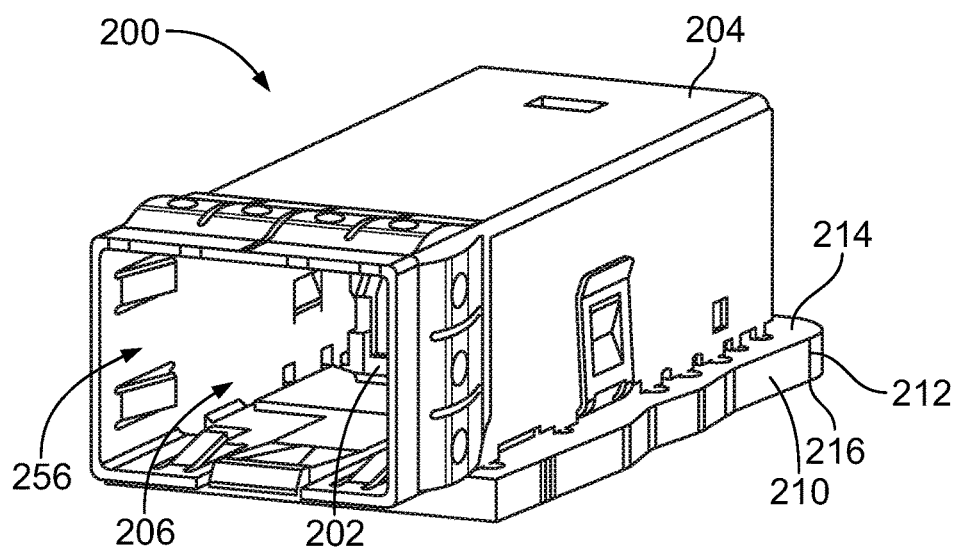
FIG. 6 is a perspective view of the receptacle connector assembly showing a receptacle connector terminated to a circuit board of the receptacle connector assembly.

FIG. 5 is an exploded view of the receptacle connector assembly 200, and FIG. 6 is a perspective view of the receptacle connector assembly 200 showing the receptacle connector 202 terminated to the circuit board 210. The receptacle connector assembly 200 includes a receptacle housing 204, which may be referred to as a cage 204, which defines a receiving cavity 206 for the pluggable connector assembly 100 (shown in FIG. 2). The receptacle connector 202 is disposed within the receiving cavity 206 and is mounted to the circuit board 210. The receptacle connector 202 has mating slot 208 (FIG. 5) that is sized and shaped to receive the mating edge 118 (FIG. 3) of the circuit board 110 (FIG. 3).

The circuit board 210 includes a substrate 212 having a first surface 214 and a second surface 216 opposite the first surface 214. The circuit board 210 has a mating area 218 configured to receive the receptacle connector 202. The circuit board 210 may be a layered structure, such as manufactured through printed circuit board (PCB) technologies. The circuit board 210 may be a laminate or sandwich structure that includes a plurality of stacked substrate layers having conductive elements that extend on or between the substrate layers (e.g., traces, ground planes, and the like) and/or extend through the substrate layers (e.g., vias, plated thru-holes, and the like). By way of example, the substrate layers may include a dielectric material and may also include a bonding material. The conductive elements may be disposed, deposited, or etched in a predetermined manner within or along the substrate layers.

In an exemplary embodiment, the substrate 212 has a plurality of signal conductors 220 and a plurality of ground conductors 222. The signal conductors 220 and/or ground conductors 222 may be traces, pads, planes, plated vias, and the like. The conductive pathways defined by the signal and ground conductors 220, 222 are positioned relative to each other to form a designated pattern or array that is suitable for communicating data signals at the desired data rate. In particular embodiments, the signal conductors 220 form signal pairs in which each signal pair is flanked on both sides by ground conductors 222 such as in a ground-signal-signal-ground (GSSG) array. The ground conductors 222 electrically separate the signal pairs to reduce electromagnetic interference or crosstalk and to provide a reliable ground return path. Other embodiments, however, may not include signal pairs. For example, each signal conductor 220 may be flanked on both sides by ground conductors 222 or many signal conductors 220 may be provided between corresponding ground conductors 222. In an exemplary embodiment, the ground conductors 222 include or are coupled to lossy material to dampen or absorb resonance in the circuit board 210.

In an exemplary embodiment, the signal and ground conductors 220, 222 including respective signal and ground contact pads 224, 226 in the mating area 218 of the substrate 212 for interfacing with corresponding contacts of the receptacle connector 202. The contact pads 224, 226 may be solder pads that allow the contacts to be soldered thereto on one or both of the surfaces 214, 216. The contact pads 224, 226 may be wider than other portions of the conductors 220, 222, such as the traces on the various layers of the substrate 212. The contact pads 224, 226 may define a contact array at the mating area 218.

In an exemplary embodiment, the substrate 212 has a plurality of signal vias (not shown) and a plurality of ground vias 230 extending at least partially through the substrate 212 between the first and second surfaces 214, 216. The ground vias 230 may be plated or non-plated. The signal and/or ground vias 230 may extend partially through the substrate 212, such as to one or more signal layers or ground planes 232, or may extend entirely through the substrate 212 as plated through-holes. The signal and/or ground vias 230 allow the conductors 220, 222 to extend to other layers of the circuit board 210, such as internal signal layers, ground planes 232, and the like. The signal and/or ground vias 230 may receive corresponding tails or pins of the contacts of the receptacle connector 202, such as solder tails or compliant pins. The signal and/or ground vias 230 form portions of the signal and ground conductors 220, 222. The conductors 220, 222 may include traces on the surface(s) 214, 216 that extend to corresponding plated signal and/or ground vias 230. For example, the signal and/or ground vias 230 may be coupled to the signal and ground contact pads 224, 226 by intervening traces. In alternative embodiments, rather than having surface contact pads 224, 226, the substrate 212 may include the signal and/or ground vias 230 at the surface 214 or 216 that extend to other layers of the circuit board 210. In such embodiments, the contact pads 224, 226 may be arranged at internal layers of the circuit board around the signal and/or ground vias 230. The openings to the signal and/or ground vias 230 may define the contact pads 224, 226 in various embodiments.

Lossy plugs 240 at least partially fill the ground vias 230. The lossy plugs 240 are manufactured from lossy material capable of absorbing electrical resonance propagating through the substrate 212. In an exemplary embodiment, the lossy plugs 240 include lossy material configured to absorb at least some electrical resonance that propagates along the current paths defined by the signal conductors 220 and/or the ground conductors 222 through the circuit board 210.

The receptacle connector 202 is terminated to the circuit board 210, such as by a soldered connection, a press-fit connection or another type of connection. The receptacle connector 202 includes a connector housing 250 that holds signal and ground contacts 252, 254 (FIG. 5) arranged in one or more rows. In the illustrated embodiment, the contacts 252, 254 are held in two rows along respective opposite sides of the mating slot 208 for mating with the contact pads 124, 126 (shown in FIG. 4) of the circuit board 110. The signal and ground contacts 252, 254 include contact tails that are configured to be terminated to the conductors 220, 222. Optionally, the contact tails may be solder tails, which may be surface mounted or through-hole mounted to the circuit board 210. Alternatively, the contact tails may include compliant pins press-fit into the circuit board 210.

The cage 204 has a port or opening 256 that provides access to the receiving cavity 206. The cage 204 is mounted to the circuit board 210 and may have compliant pins that engage the circuit board 210. The cage 204 may be electrically connected to the circuit board 210, such as to the ground plane 232 of the circuit board 210, through plated vias.

Figure 7:
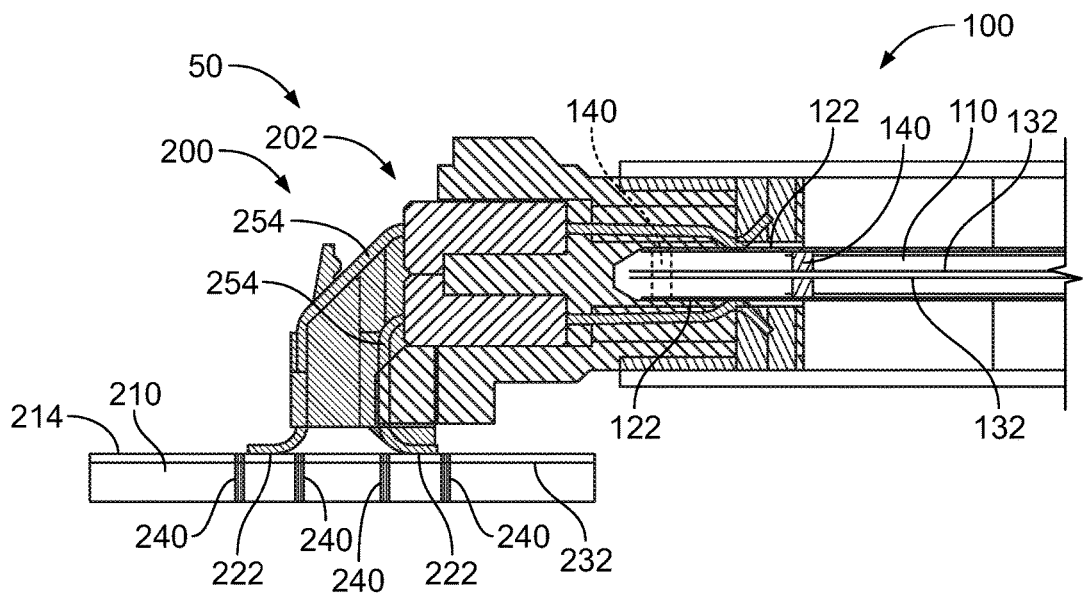
FIG. 7 is a cross-sectional view of the interconnect system showing the pluggable connector assembly mated with the receptacle connector assembly.
Figure 8:
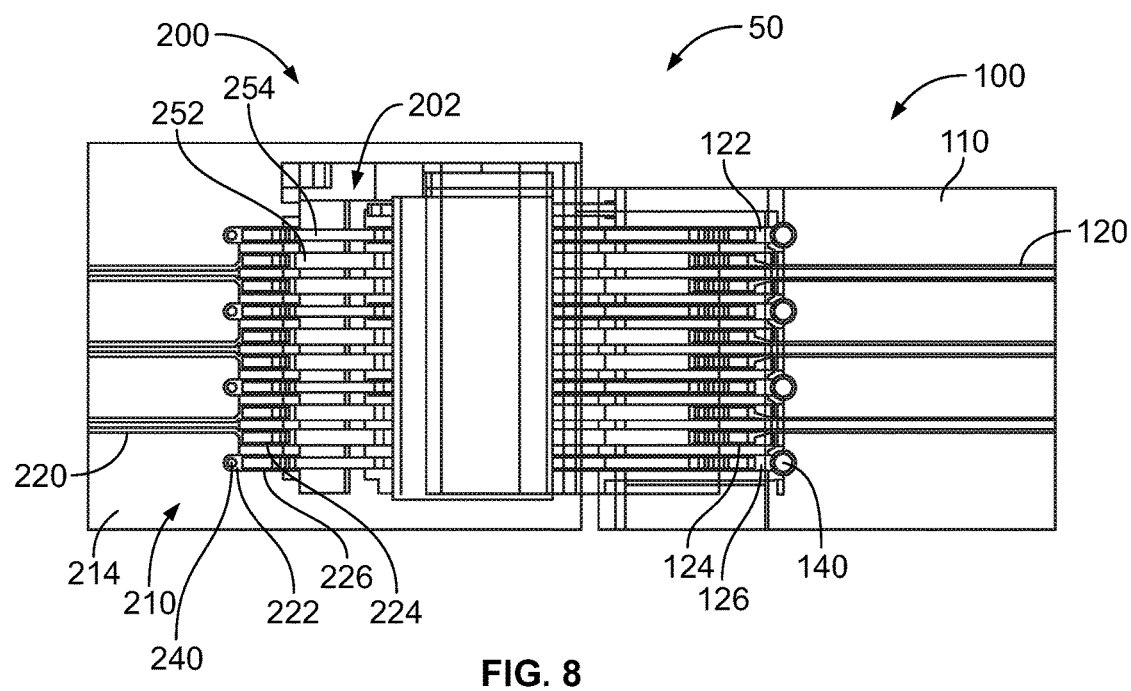
FIG. 8 is a top view of the interconnect system showing the pluggable connector assembly mated with the receptacle connector assembly.

FIG. 7 is a cross-sectional view of the interconnect system 50 showing the pluggable connector assembly 100 mated with the receptacle connector assembly 200. FIG. 8 is a top view of the interconnect system 50 showing the pluggable connector assembly 100 mated with the receptacle connector assembly 200 with portions of the pluggable connector assembly 100 and the receptacle connector assembly 200 removed to illustrate the mating interface therebetween. The lossy plugs 140, 240 are illustrated at various locations within the system; however, the lossy plugs 140, 240 may be provided at other locations in alternative embodiments. For example, an optional location for the lossy plugs 140 closer to the mating end of the circuit board 110 is illustrated in phantom in FIG. 7.

When assembled, the signal and ground contacts 252, 254 of the receptacle connector 202 are terminated to the circuit board 210. For example, the tails are soldered to the signal and ground contact pads 224, 226 on the first surface 214 of the circuit board 210. When the pluggable connector assembly 100 is mated to the receptacle connector assembly 100, the signal and ground contacts 252, 254 of the receptacle connector 202 are mated to the signal and ground contact pads 124, 126. Signal pathways are created from the signal conductors 120 of the circuit board 110, through the signal contacts 252, to the signal conductors 220 of the circuit board 210. Ground pathways are created from the ground conductors 122 of the circuit board 110, through the ground contacts 254, to the ground conductors 222 of the circuit board 210. The lossy plugs 140, 240 are provided in the signal pathways to absorb at least some electrical resonance that propagates along the current paths defined through the assemblies 100, 200.

During operation of the interconnect system 50, data signals are transmitted through the signal pathways and electrical energy flows along the surface of each ground pathway. The electrical energy flowing along the ground pathways may form a field that propagates between the ground pathways. Without the damping provided by the lossy plugs 140, 240, the field may reflect and form a standing wave (or resonating condition) at certain frequencies. The field may reflect, for example, between the ground planes 132 of the circuit board 110 and/or between the ground planes 232 of the circuit board 210. The lossy plugs 140, 240 are configured to impede the development of these standing waves (or resonating conditions) at certain frequencies and, consequently, reduce the unwanted effects of the electrical noise. For example, in some embodiments, the lossy plugs 140, 240 may absorb some of the electrical energy and/or drain the electrical energy. In some embodiments, the lossy plugs 140, 240 effectively change or dampen the reflections such that the standing wave (or the resonating condition) is not formed during operation of the interconnect system 50.

It is to be understood that the above description is intended to be illustrative, and not restrictive. Moreover, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." An element recited in the singular and proceeded with the word "a" or "an" should be understood as not excluding plural of said elements, unless such exclusion is explicitly stated. Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A circuit board comprising:
a substrate having a first surface and a second surface opposite the first surface;
the substrate having a plurality of signal conductors configured to carry electrical signals and a plurality of ground conductors being electrically grounded, the signal and ground conductors including respective contact pads in a mating area of the substrate for engaging corresponding contacts of an electrical connector; and
the substrate having a plurality of ground vias extending at least partially through the substrate between the first and second surfaces, the ground vias being plated, the ground vias being electrically coupled to corresponding ground conductors, the ground vias including lossy plugs at least partially filling the plated ground vias, the lossy plugs being electrically coupled to the ground conductors, the lossy plugs manufactured from lossy material capable of absorbing electrical resonance propagating through the substrate to provide resonance control, wherein the lossy plugs are only coupled to the corresponding ground conductors and are not electrically coupled to the signal conductors.

2. The circuit board of claim 1, wherein the substrate includes a ground plane electrically connected to the ground vias and the lossy plugs.

3. The circuit board of claim 1, wherein the contact pads are provided on both the first and second surfaces of the substrate.

4. The circuit board of claim 1, wherein each ground conductor is coupled to at least one ground via and associated lossy plug.

5. The circuit board of claim 1, wherein each ground conductor is coupled to at least two ground vias and associated lossy plugs.

6. The circuit board of claim 1, wherein the lossy plugs substantially fill the ground vias.

7. The circuit board of claim 1, wherein the ground vias extend entirely through the substrate between the first and second surfaces, the lossy plugs substantially filing the ground vias such that the lossy plugs are provided at the first surface and at the second surface.

8. The circuit board of claim 1, wherein the lossy plugs are exposed at at least one of the first surface and the second surface.

9. The circuit board of claim 1, wherein the lossy plugs pass through at least one ground plane of the substrate.

10. The circuit board of claim 1, wherein the substrate includes a plurality of layers, the signal conductors being routed on at least two of the layers, the lossy plugs passing through each of the layers having the signal conductors.

11. The circuit board of claim 1, wherein the ground vias and the lossy plugs are provided in the mating area.

12. The circuit board of claim 1, wherein the ground vias and the lossy plugs are remote from the mating area.

13. The circuit board of claim 1, wherein the lossy material of the lossy plugs includes conductive particles dispersed within a dielectric binder material.

14. The circuit board of claim 1, wherein the lossy plugs provide loss in a target frequency range.

15. The circuit board of claim 1, wherein the lossy plugs are magnetically lossy.

16. The circuit board of claim 1, wherein the lossy plugs impede forming of standing waves along the ground conductors.

17. A pluggable connector comprising:
a plug housing configured to couple to a communication cable; and
a circuit board held by the plug housing and configured to be communicatively coupled to the communication cable, the circuit board having a substrate including a mating edge configured to interface with an electrical connector, the substrate including a plurality of signal conductors and a plurality of ground conductors, the signal and ground conductors including respective contact pads that are disposed proximate to the mating edge for engaging corresponding contacts of the electrical connector, the substrate having a plurality of plated ground vias extending at least partially through the substrate, the plated ground vias being coupled to corresponding ground conductors, the ground vias including lossy plugs at least partially filling the ground vias, the lossy plugs being electrically coupled to the ground conductors, the lossy plugs manufactured from lossy material capable of absorbing electrical resonance propagating through the substrate to provide resonance control, wherein the lossy plugs are only coupled to the corresponding ground conductors and are not electrically coupled to the signal conductors.

18. The pluggable connector of claim 17, wherein the lossy plugs pass through at least one ground plane of the substrate.

19. The pluggable connector of claim 17, wherein the lossy material of the lossy plugs includes conductive particles dispersed within a dielectric binder material.

20. An interconnect system comprising:
a receptacle connector assembly having a first circuit board and a receptacle connector mounted to the first circuit board, the receptacle connector having a receiving cavity, the receptacle connector including an array of electrical contacts disposed within the receiving cavity, the electrical contacts include signal contacts and ground contacts, the first circuit board includes a first substrate and signal conductors and ground conductors routed on the first substrate, the signal contacts of the receptacle connector are terminated to corresponding signal conductors of the first circuit board and the ground contacts of the receptacle connector are terminated to corresponding ground conductors of the first circuit board, the first circuit board includes a plurality of plated ground vias extending at least partially through the first substrate being coupled to corresponding ground conductors, the plated ground vias including lossy plugs at least partially filling the plated ground vias, the lossy plugs being electrically coupled to the ground conductors, the lossy plugs being manufactured from lossy material capable of absorbing electrical resonance propagating through the substrate, wherein the lossy plugs are only coupled to the corresponding ground conductors and are not electrically coupled to the signal conductors; and
a pluggable connector assembly configured to be inserted into the receiving cavity of the receptacle connector during a mating operation, the pluggable connector assembly including a second substrate having a first surface and a second surface opposite the first surface, the second substrate having a plurality of signal conductors and a plurality of ground conductors, the signal and ground conductors including respective contact pads in a mating area of the second substrate for engaging corresponding signal and ground contacts of the receptacle connector, and the second substrate having a plurality of plated ground vias extending at least partially through the second substrate between the first and second surfaces, the plated ground vias being coupled to corresponding ground conductors of the second substrate, the plated ground vias including lossy plugs at least partially filling the plated ground vias, the lossy plugs being electrically coupled to the ground conductors, the lossy plugs manufactured from lossy material absorbing electrical resonance propagating through the substrate, wherein the lossy plugs are only coupled to the corresponding ground conductors and are not electrically coupled to the signal conductors.

* * * * *